United States Patent [19]
Feely

[11] Patent Number: 5,344,748
[45] Date of Patent: Sep. 6, 1994

[54] MICROPLASTIC STRUCTURE AND METHOD OF MANUFACTURE

[75] Inventor: Wayne E. Feely, Rydal, Pa.

[73] Assignee: Rohm and Haas Company, Philadelphia, Pa.

[21] Appl. No.: 524,683

[22] Filed: May 16, 1990

Related U.S. Application Data

[63] Continuation of Ser. No. 83,931, Aug. 5, 1987, abandoned, which is a continuation of Ser. No. 818,571, Jan. 13, 1986, abandoned.

[51] Int. Cl.$^5$ ................................................ G03C 5/00
[52] U.S. Cl. .................................. 430/330; 427/510; 430/270; 430/311; 430/320; 430/325; 430/326
[58] Field of Search ............... 430/330, 270, 311, 320, 430/325, 326; 427/54.1

[56] References Cited

U.S. PATENT DOCUMENTS

| | | | |
|---|---|---|---|
| 3,634,082 | 1/1972 | Christensen | 430/309 |
| 3,637,381 | 1/1972 | Hallman et al. | 430/306 |
| 3,697,274 | 10/1972 | Herrmann | 430/309 |
| 3,997,345 | 12/1976 | Sakurai et al. | 430/306 |
| 4,015,986 | 4/1977 | Paal et al. | 430/330 |
| 4,093,461 | 6/1978 | Loprest et al. | 430/330 |
| 4,374,911 | 2/1983 | Harley | 430/5 |
| 4,387,152 | 6/1983 | Stahlhofen | 430/330 |
| 4,404,272 | 9/1983 | Stahlhofen | 430/330 |
| 4,421,844 | 12/1983 | Buhr | 430/330 |
| 4,465,760 | 8/1984 | Leyrer et al. | 430/330 |
| 4,565,771 | 1/1986 | Lynch et al. | 430/330 |

FOREIGN PATENT DOCUMENTS 1212260 11/1970 United Kingdom .

OTHER PUBLICATIONS

DeForest, Photoresist, Materials and Processes, 1975, pp. 46–59.

*Primary Examiner*—Jack P. Brammer
*Attorney, Agent, or Firm*—Brian W. Stegman

[57] ABSTRACT

Thermally stable microplastic structures and methods for their manufacture are provided. The microplastic structures are prepared from crosslinkable photosensitive compositions using a specially designed radiation attenuating photomask which permits preselection of the size, length, width and thickness of the desired structure. The microplastic structures are stable at temperatures in excess of 200° C. and can be used as components in miniature electrical, mechanical, chemical and optical devices, such as smart sensors integral to a silicon chip device.

10 Claims, 12 Drawing Sheets

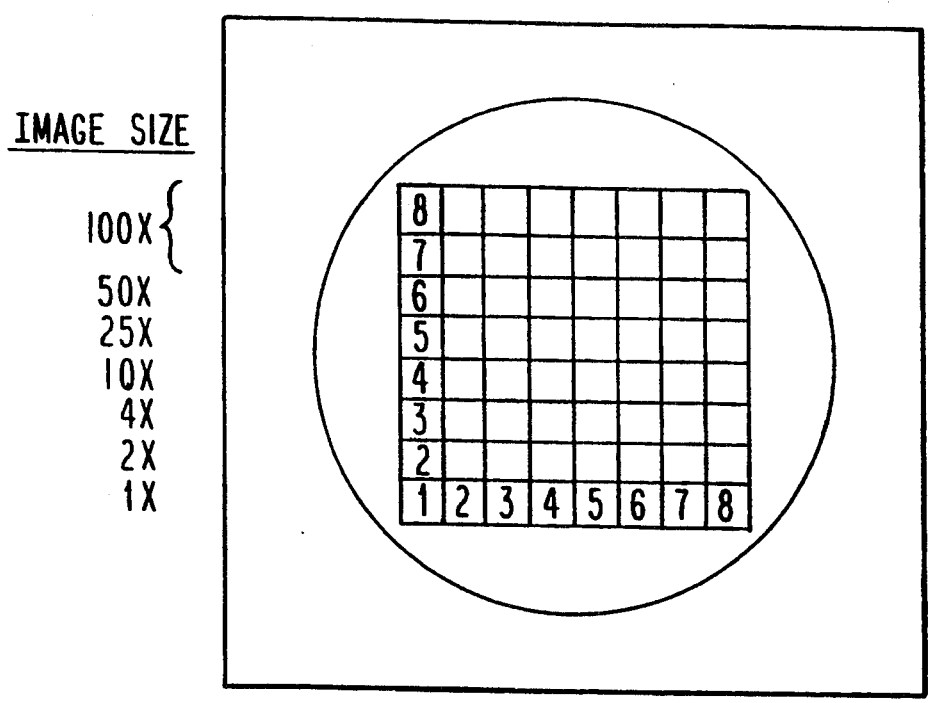
Fig.1
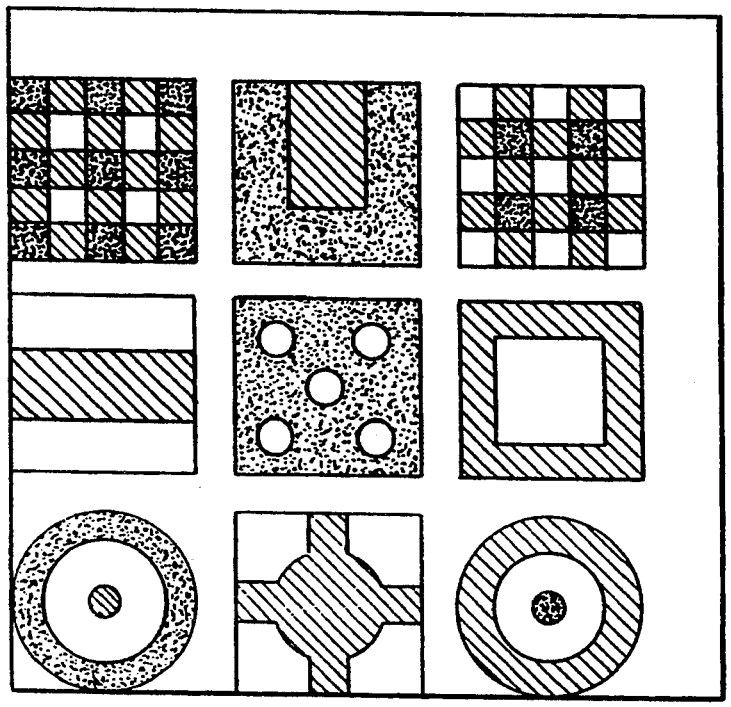
Fig.2 IMAGE CLUSTERS LIGHT MARGIN MASK
LEGEND: ▨ SEMI-TRANSPARENT  ▨ OPAQUE  ☐ TRANSPARENT

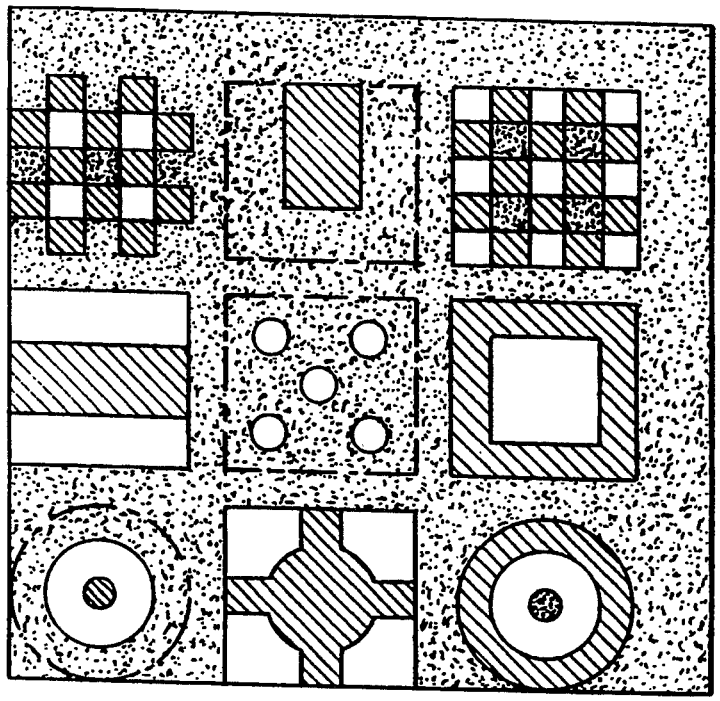
Fig. 3
IMAGE CLUSTERS DARK MARGIN MASK
LEGEND:
- SEMI-TRANSPARENT
- TRANSPARENT
- OPAQUE
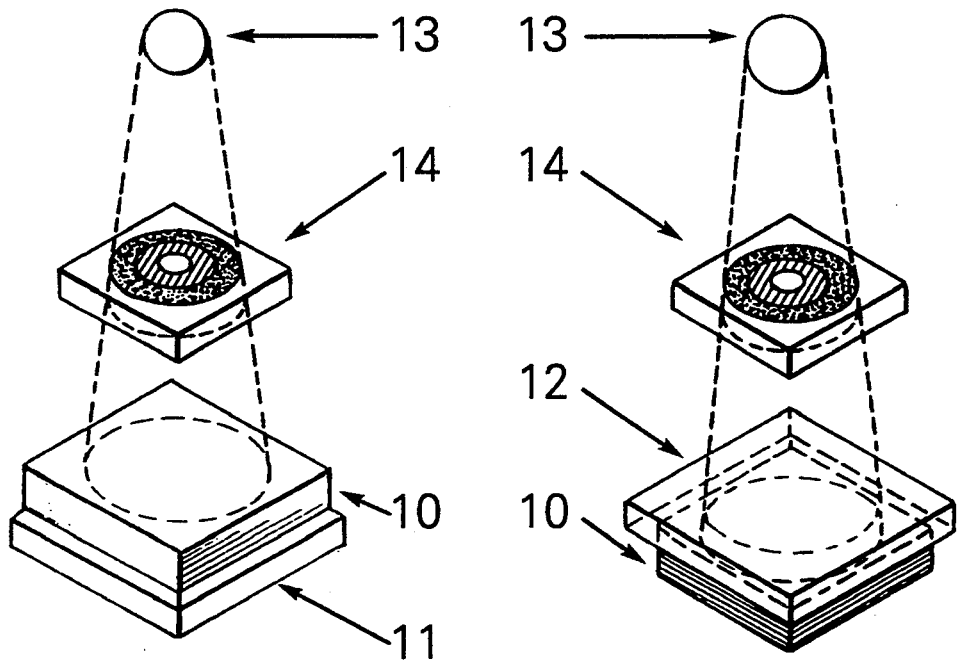
Fig. 4a   Fig. 4b

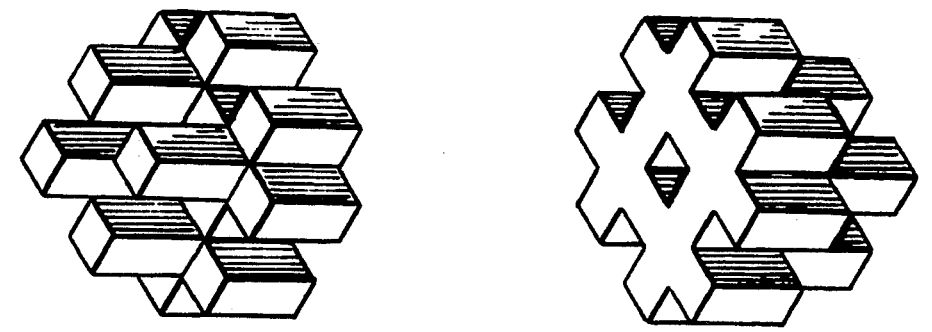
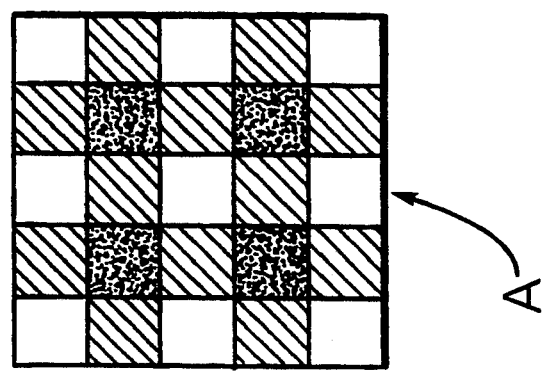
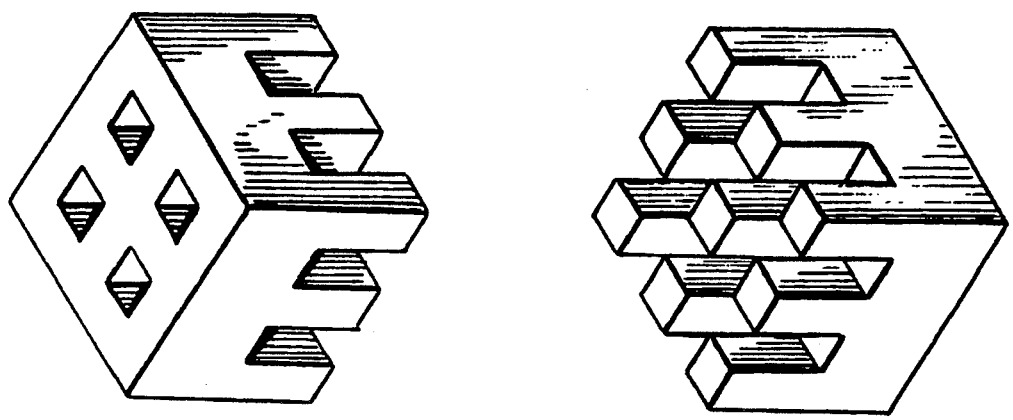
Fig. 5

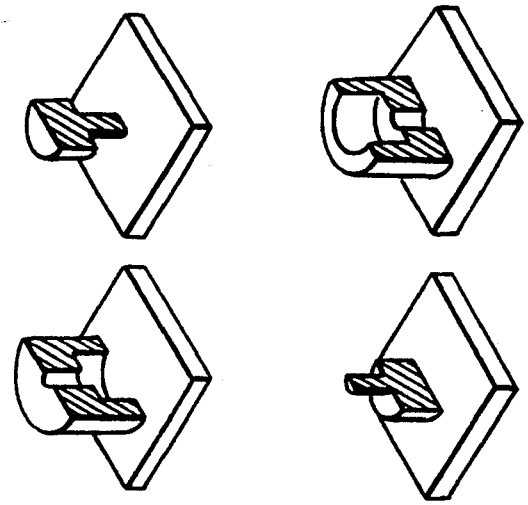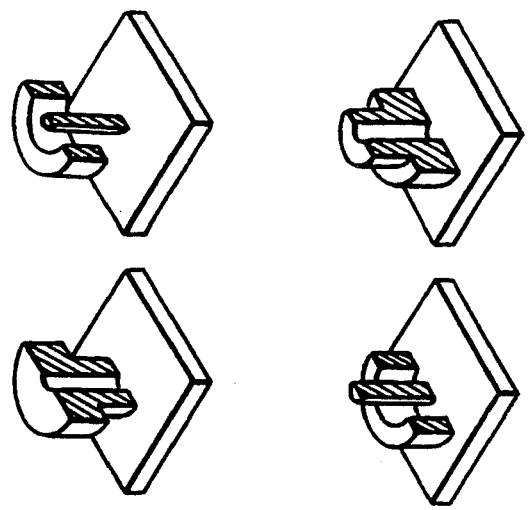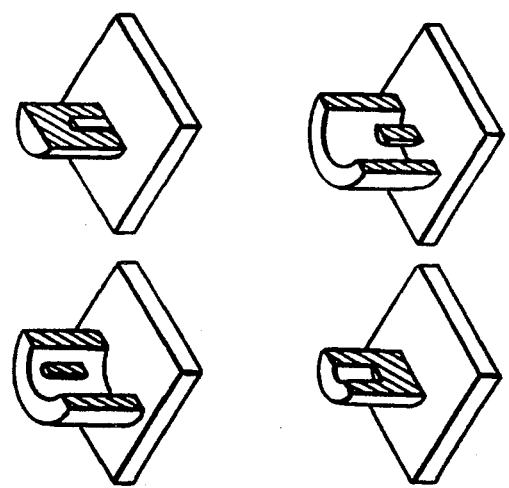
Fig. 10b

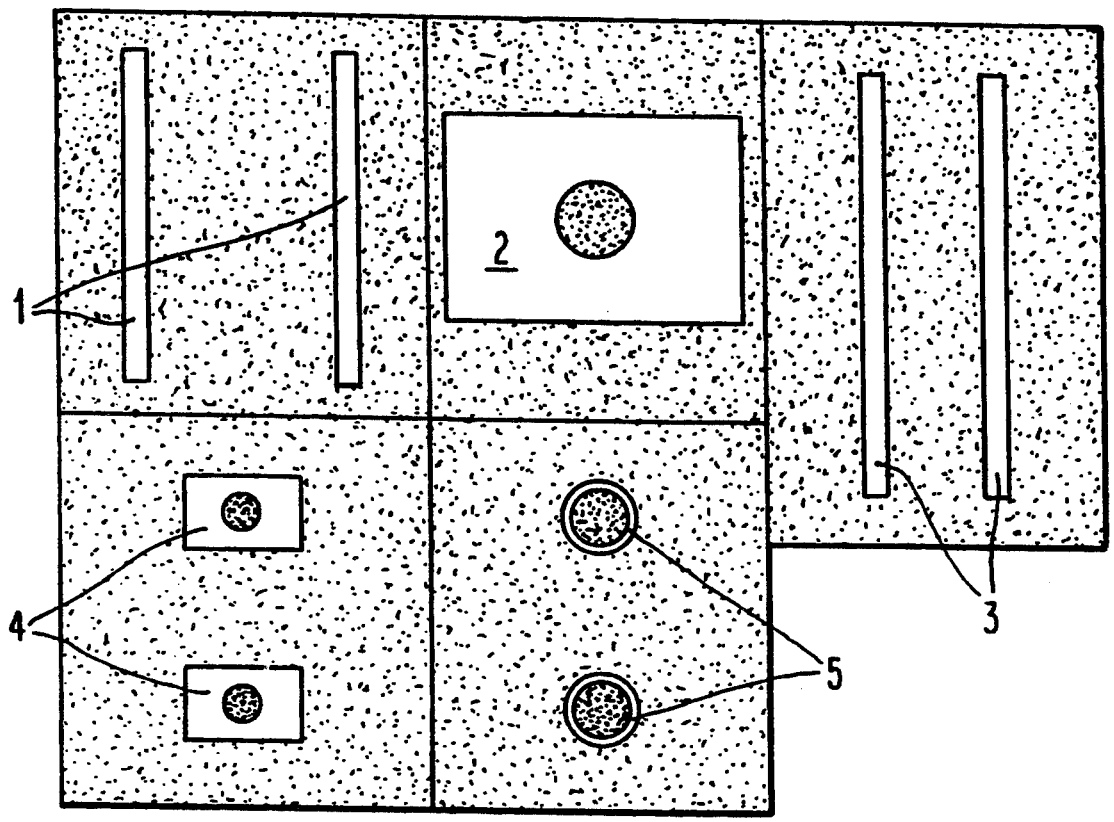
_Fig. 13_
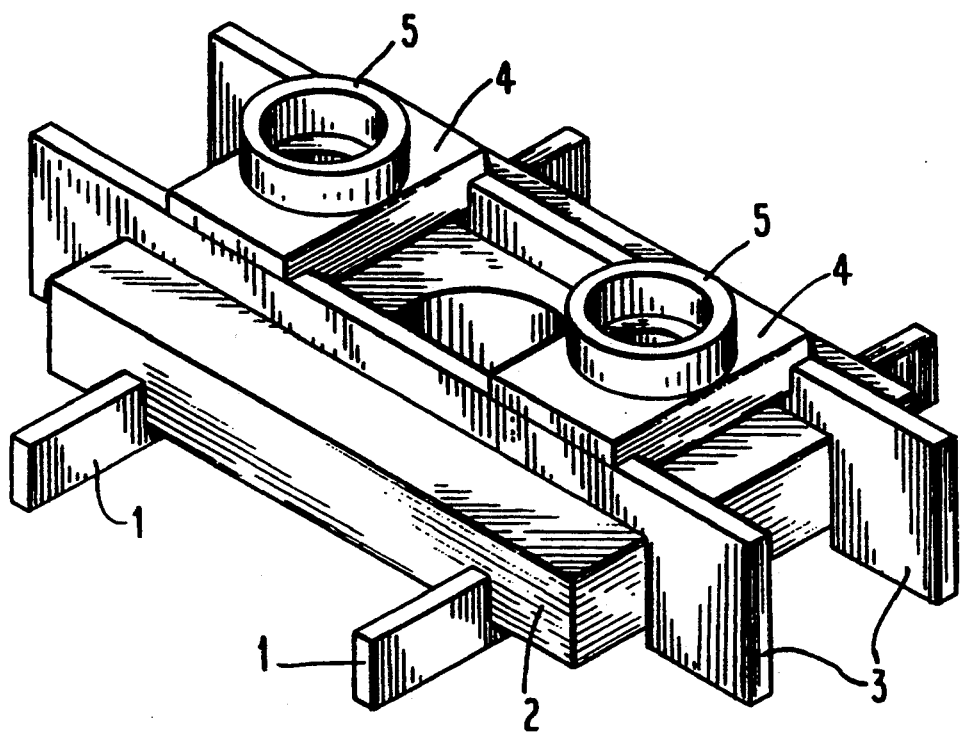
_Fig. 14_

MICROPLASTIC STRUCTURE AND METHOD OF MANUFACTURE

This application is a continuation, of application Ser. No. 83,931, filed Aug. 5, 1987, now abandoned, which is a continuation, of application Ser. No. 818,571, filed Jan. 13, 1986 now abandoned.

Related Applications

The present invention is related to my copending U.S. patent application Ser. No. 616,518, filed in the United States Patent and Trademark Office on Jun. 1, 1954, entitled Thermally Stable Polymer Images and Processes. The invention is also related to my copending U.S. Patent application entitled Photosensitive Compounds Thermally Stable and Aqueously Developable Negative Images filed in the United States Patent and Trademark Office simultaneously herewith.

1. Field of the Invention

This invention is directed to the formation of microplastic structures. "Microplastic structures" as used herein shall refer to crosslinked polymer articles which are thermally stable to temperatures in excess of 200° C. and where the size, length, width and thickness of the desired structure can be independently selected before fabrication. More particularly, the invention is directed to microplastic structures formed from acid hardening resin systems and selected photoacid generating compounds utilizing a radiation attenuating photomask.

2. Background of the Invention

Microelectronics have been revolutionizing how we communicate, store and process information. Complex electrical circuits and devices can now be placed onto a single silicon chip. Rapid advances are continuing to be made in accelerating the processes used to incorporate electrical circuits onto silicon chips and in miniaturizing the circuits and devices containing them. Miniaturization of electrical circuits has resulted in a demand for smaller electrical, mechanical, chemical and optical devices such as sensors used with silicon chip circuits. A "sensor" is a device that converts a physical, chemical or optical change in a system into an electrical signal. The signal may be transmitted to a computer or microprocessor for measurement or response to the change in accordance with a set of programmed instructions. For example, a microprocessor may respond to a signal from a sensor by sending another signal to another device, such as an actuator, which regulates one or more variables in the system, thereby automatically controlling the system. Sensors may be used to measure or compensate for changes in a number of parameters such as size, angle, position, vibration, motion, velocity, acceleration, rotation, force, torque, time, mass, density, color, luminance, radiation, flow, volume, level, sound, humidity, acidity, temperature, pressure and the like. See Tschulena and Selders, *Sensor Technology in the Microelectronic Age*, Battelle Technical Inputs to Planning, Report No. 40 (1984); R. Allen, *Sensors in Silicon*, High Tech Sept. 1984, page 43; J. McDermott, Popular Science, June 1984 page 87; Transducers '85, 1985 International Conference on Solid-State Sensors and Actuators, IEEE; H. Wohltzen, Anal. Chem. 56 (1) 16 (A) (1984).

Traditionally sensors have been fabricated separately from the silicon chip circuits, thereby requiring connection thereto by wires. There is a growing interest in what are commonly referred to as "smart" sensors which are constructed as integral elements of the silicon circuitry itself such as for use in robotics.

Structures in which two dimensions are independently selected prior to fabrication have been developed by the anisotropic etching of a silicon wafer, along its crystalline planes, to take advantage of the mechanical and electrical properties of the silicon itself. Anisotropic etching of two dimensional patterns has been used with photolithographic materials such as in the construction of ink Jet printer nozzles where the uniformity and size of the orifice is critical: U.S. Pat. Nos. 3,921,916 and 4,007,464. A complete miniature gas chromatographic device fabricated on a silicon wafer capable of resolving six component mixtures has also been reported: U.S. Pat. No. 3,538,744 and K. E. Peterson, Proc. IEEE 70(5), pg. 420 (1982). These subtractive techniques require the removal of portions of the silicon itself to leave a structure thereon and do not contemplate the addition of a photosensitive coating to the silicon surface and the processing of the coating to form the structure, hereinafter referred to as an "additive" technique.

At the present time, however, there is no acceptable or simple additive technique for preparing three dimensional microplastic structures directly on the surface of a silicon wafer to function as a smart sensor. Conventional photoresist compositions cannot be used to form microplastic structures for a number of reasons. Conventional photoresist materials are typically not thermally stable to temperatures in excess of about 120° C., and are only useful to produce two-dimensional or stencil images having a fixed thickness, aspect ratios of about 1.5, and a maximum commercial resolution capability of about 1.5 microns. "Aspect ratio" as used herein refers to the maximum ratio of image or structure height or thickness to image or structure width, respectively. An aspect ratio of 1.5 therefore means that for an image or structure of a given width the maximum image or structure height is 1.5 times its width.

As used in the present invention the term "independently selected", as it relates to the dimensions of a microplastic structure, has a specific meaning. It means not only that the thickness, width and length of the structure can be selected independently prior to fabrication, within the aspect ratio and resolution capability of the photosensitive composition used in the process, but also that each of these dimensions can be varied throughout the structure. For example, the thickness of a structure at its center may be different from its thickness at other points in the structure. Thus, "independent selection" of the microplastic structure contemplates the pre-fabrication selection of structures having an almost limitless number of different configurations and sizes.

Prior attempts at fabricating microplastic structures have utilized the placement of thermally stable, photosensitive polyimide dielectric pads as permanent structures on wafer surfaces. See *Polymers in Electronics*, ACS Symposium Series No. 242 (1984) pages 239–258 and references cited therein. The photosensitive coatings used to form the polyimide pads are difficult to handle and can only be imaged in the plane parallel to the surface onto which the coating is deposited (length and width) but not in a plane perpendicular to the surface (height or thickness). Accordingly only two dimensionally variable or stencil structures, analogous to cookies cut from a baking pan using a cookie cutter, may be prepared by this technique.

The only reported attempt to prepare independently selected three dimensional structures using a photosensitive composition and an additive technique was described by William Salmre in *Three Dimensional Microfabrication on Thick Film Photoresist Mandrels,* SPIE Vol. 469 Advances in Resist Technology (1984). Salmre found that it was not possible, however, to produce crosslink structures from a thick film resist by exposing the top side (side farthest from the surface on which the resist is deposited) of the resist to actinic radiation through a conventional photomask. Salute found that when the resist was laminated directly onto the photomask and exposed from below the surface (bottom side), instead of from the top side, it was possible to prepare conically shaped thermoplastic structures which, while limited in thickness, did not topple over as easily as the structures formed from top side imaging. Salmre also suggested aligning multiple photomasks and exposing the resist from both the top and bottom sides to produce more vertically perpendicular structures. Salmre's photomasks also functioned as the substrate itself and are disclosed as being useful as mandrels for depositing electroformed, plated or deposited parts. Salmre described the formation of hemispherical blobs or retorts by modifying the bottom side exposure dosage followed by development, and reexposure from the top side through a second mask followed by subsequent redevelopment. By using multiple resists and masks and by exposing the resists from both the top and bottom sides, Salmre suggests that structures having other shapes such as a stepped mandrel ("Ziggurat"), volcanic ("Fujiyama") or a parabolic ("Sombrero") shape are possible. Salmre acknowledges the difficulty in aligning the masks using elaborate equipment and claims that such elaborate equipment need not be used if a positive-acting photosensitive sheet fastened to the photomask were used. Salmre concluded by speculating on other shaped articles, such as "ant hills", that could possibly be formed using other techniques such as laser holography.

As indicated by Salmre the possibilities in this field are unlimited; however, Salmre's process requires simplification and other modifications for it to be of commercial utility. For example, for commercial applications, it would be desirable to have crosslinked, thermally and dimensionally stable structures which resist attack by common solvents and temperatures of at least 200° C.

My previous experimentation with dual acting photoresists used to form thermally stable images, of about 10 microns in thickness, on surfaces led me to investigate the possibility of creating independently selected three dimensional, thermally-stable, microplastic structures by a simple additive technique so that the structures could be used for a variety of commercial applications including smart sensors.

It is an object of the present invention, therefore, to provide a process for the preparation of three dimensional, thermally stable, microplastic structures capable of being used in electrical, mechanical, chemical or optical devices.

It is an additional object of the present invention to prepare such thermally stable microplastic structures, having individually selected micron size dimensions, directly on the surface of a silicon wafer without requiring multiple photomasks or elaborate alignment equipment and procedures and by using a technique which is compatible with conventional integrated circuit production techniques.

It is also an object of the present invention to prepare layered microplastic structures where multiple structures are aligned and connected one on top of another.

It is a further object of the invention to provide microplastic structures having a variety of configurations suitable for a wide range of use in or with electrical, chemical, mechanical or optical devices.

SUMMARY OF THE INVENTION

I have found a process for preparing thermally stable, micron scale microplastic structures where each dimension can be independently selected using selected crosslinkable photosensitive compositions preferably in combination with a specially designed radiation attenuating photomask. The crosslinked microplastic structures so formed are stable to temperatures in excess of 200° C. and can be prepared with a limitless variety of shapes without the need for elaborate alignment, multiple exposure and redevelopment techniques. This process permits the fabrication of low cost structures useful as components of electrical, chemical, mechanical and optical systems such as smart sensors.

BRIEF DESCRIPTION OF THE DRAWINGS

FIG. 1 presents a pictorial representation of the radiation attenuating photomask map.

FIG. 2 presents a drawing of the image clusters of the light margin design photomask.

FIG. 3 presents a drawing of the image clusters of the dark margin design photomask.

FIG. 4A and 4B illustrate top and bottom imaging of a photoresist respectively.

FIG. 5 illustrates the checkerboard mask pattern (light margin Pattern A) and the microplastic structures formed therefrom in the negative and positive (near UV) modes using top and bottom imaging.

FIG. 13 illustrates conventional photomask patterns for a five level microplastic structure.

FIG. 14 illustrates the five level microplastic structure formed using the photomask patterns of FIG. 13.

FIG. 15 is a scanning electron micrograph of a silicon wafer containing the three dimensional microplastic structures formed from the photosensitive composition of the invention as illustrated in example 1 (2) at −1,4 magnified about 300 times.

DETAILED DESCRIPTION OF THE INVENTION

Figure 6:
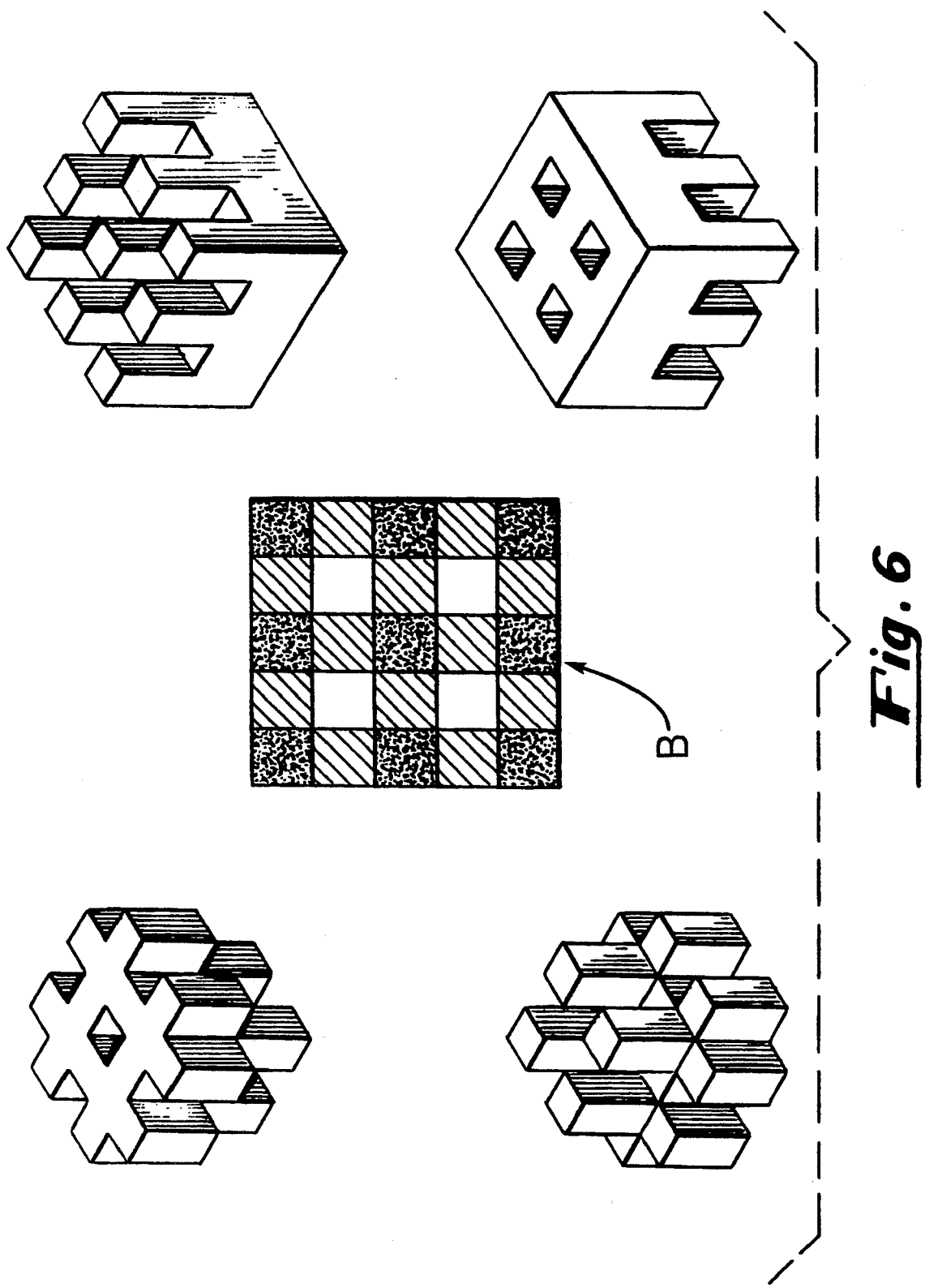
FIG. 6 illustrates the checkerboard mask pattern (dark margin Pattern B) and the microplastic structures formed therefrom in the negative and positive (near UV) mode using top and bottom imaging.

I have found a process which is useful for forming thermally stable micron size microplastic structures having three, independently selected, dimensions. The process generally involves the selection of a suitable photosensitive composition, the deposition of the photosensitive composition as a coating on a surface, the exposure of the coating to actinic radiation, in the near or deep ultraviolet wavelength regions, through a specially designed radiation attenuating photomask having a preformed pattern conforming to the dimensions of the desired microplastic structure, and the development of the microplastic structure by removing portions of the coating using an aqueous solution. The microplastic structures may be prepared in the positive or negative mode using near ultraviolet exposing radiation and in the negative mode using deep ultraviolet exposing radiation.

The photosensitive composition contains a crosslinkable polymer and a sufficient amount of a selected photoacid generating compound for crosslinking the polymer when the photoacid generator is activated by a sufficient quantity of the selected actinic radiation. Overall, the photosensitive composition contains from about 40 to about 99.9 weight percent of said crosslinkable polymer-containing composition acid hardening resin system and from about 0.1 to about 60 weight percent of a suitable photoacid generator.

The polymers useful in the photosensitive composition include acid hardening resin systems as described in detail in my copending patent application Ser. No. 616,518 which is hereby incorporated, in pertinent part, by reference herein. The acid hardening resin systems contain a polymer that crosslinks in the presence of an acid catalyst and heat. The acid hardening resin system may be prepared from a variety of aminoplast or phenoplast resins in combination with compounds or low molecular weight polymers that contain a plurality of hydroxyl, carboxyl, amide or imide groups.

Suitable aminoplast resins include urea-formaldehyde, benzoquanamine-formaldehyde, melamine-formaldehyde, glycoluril-formaldehyde resins and combinations thereof. The aminoplasts are used in combination with reactive hydrogen-containing compounds such as novolak resins, polyvinylphenol, polyglutarimide, poly(meth)acrylic acid copolymers, alkali soluble polyacrylamide and polymethacrylamide copolymers, copolymers containing 2-hydroxyethyl acrylate and methacrylate, polyvinyl alcohols, such as those prepared from partially hydrolyzed polyvinylacetates, alkali soluble styrene-allyl alcohol copolymers and mixtures thereof. Preferred reactive hydrogen-containing compounds are novolak resins containing hydroxyl groups and sites for the electrophilic substitution of aromatic rings at positions ortho or para to the hydroxyl group, having a weight average molecular weight in the range of from about 300 to about 100,000 and preferably from about 1000 to about 20,000.

The acid hardening resin system may be prepared by combining a phenoplast resin with a latent formaldehyde generating compound such as s-trioxane, N(2-hydroxyethyl) oxazolidine and oxazolidinylethyl methacrylate.

The polymer in the photosensitive composition can be selected based on known specific and desirable chemical and/or physical properties so that the microplastic structures, which are formed therefrom, have the mechanical, chemical, electrical and/or optical properties needed for a specific application. For example, an acid hardening resin system which has a specific modulus of elasticity, reactivity towards enzymes, resistance to the flow of electrons and/or refractive index can be selected for preparing microplastic structure for a specified end use application.

The photoacid generating compounds useful in combination with the crosslinkable polymer containing composition are neutral compounds or mixtures which are converted to acids upon exposure to actinic radiation. The photoacid generators must be soluble in or form a homogeneous solution with the photosensitive composition containing the crosslinkable polymer itself as well as in the solvent used to form the coating solution. The deep photoacid generator must not phase separate from the photosensitive composition when the coating, deposited from the coating solution on a surface is heated to remove solvent ("soft baked"). The photoacid generator must be sufficiently developable in suitable aqueous base developer solutions to permit the removal of coating portions after exposure. The photoacid generator must be non-reactive with the components of the photosensitive composition in the absence of activating radiation and be non-reactive with the substrate itself. The photoacid generator must have no adverse effect on the adhesion, uniformity or quality of the photosensitive coating deposited on the substrate surface. The photoacid generator must be capable of crosslinking the photosensitive coating containing the crosslinkable polymer upon exposure to activating radiation and heating to elevated temperatures when utilizing the negative mode without prematurely catalyzing the crosslinking reaction at ambient temperatures. The crosslinked structure formed using the photoacid generator in combination with the crosslinkable polymer composition must be thermally stable to temperatures in excess of 200° C. The photoacid generator must also not substantially volatilize from the photosensitive coating upon softbaking to remove solvent from the coating.

I have also found it possible to prepare the microplastic structures in the negative mode using deep ultraviolet radiation by employing specially selected deep UV photoacid generators in the photosensitive composition. Deep ultraviolet radiation, hereinafter referred to as "deep UV" refers to ultraviolet radiation having a wavelength on the order of about 254 nanometers. The deep UV photoacid generators selected for use in preparing the microplastic structures of the invention are highly sensitive to deep UV radiation and insensitive to near UV radiation. These deep UV photoacid generators were selected based on their compatibility with the photosensitive coating compositions, their developability in aqueous developers and because of their high degree of sensitivity to deep UV radiation. Unlike conventional photoacid generators, such as those used in the near UV photosensitive compositions used in the process of the invention, the selected deep UV photoacid generators are capable of producing a crosslinked polymer structure when employed in the photosensitive composition, containing a suitable crosslinkable polymer, such as an acid hardening resin system, at a concentration of as low as 0.1 weight percent, based on the total solids content of the photosensitive composition, when the coating is exposed to a deep UV exposure of about 10 millijoules per square centimeter (10 mJ/cm$^2$) of the coating. These selected deep UV photoacid generators are preferably halogenated organic compounds which generate a water soluble halogen acid upon exposure to deep UV radiation. These deep UV photoacid generators are described in more detail in my copending application entitled Photosensitive Compounds and Thermally Stable and Aqueously Developable Negative Images which is incorporated in pertinent part by reference herein.

When near ultraviolet light ("near UV") having a wavelength on the order of about 365 nanometers is desired to be used to form microplastic images and structures in the positive or negative mode, the photoacid generators may be compounds or mixtures that generate aqueous soluble, carboxylic acids upon exposure to the near UV radiation. The preferred near UV photoacid generators are o-naphthoquinone diazides, and in particular the phenolic esters of naphthoquinone diazide sulfonic acids. These preferred near UV photoacid generators, as described in my copending application, Ser. No. 616,518 and references cited therein, are present in the photosensitive composition at a concentration ranging from about 5 to about 60 weight percent based on the total solids content of the photosensitive composition. Naphthoquinone diazides and polymers thereof which generate indenecarboxylic acids when exposed to near UV radiation are preferred near UV photoacid generators. Other suitable near UV photoacid generators include ortho-nitrotoluene derivatives that generate carboxylic acids when exposed to near UV radiation such as, for example, orthonitrobenzaldehyde, esters of ortho-nitrobenzyl alcohol, acetyls and hemiacetals of ortho-nitrobenzaldehyde.

Preferred photoacid generators useful with deep UV exposure are halogenated organic compounds such as:
bis-1,1-(p-chlorophenyl)-2,2,2-trichloroethane (also known as DDT),
1,1-bis [p-methoxyphenyl]-2,2,2-trichloroethane (Methoxychlor ®)
1,2,5,6,9,10-hexabromocyclodecane;
1,10-dibromodecane;
1,1-bis[p-chlorophenyl]-2,2-dichloroethane;
4,4'-dichloro-2-(trichloromethyl)benzhydrol also known as;
1,1-bis[chlorophenyl]2,2,2-trichloroethanol (Kelthane ®);
hexachlorodimethyl sulfone;
2-chloro-6-(trichloromethyl)pyridine;
0,0-diethyl-0-(3,5,6-trichloro-2-pyridyl)phosphothioate (Dursban ®)
1,2,3,4,5,6-hexachlorocyclohexane;
N(1,1-bis[p-chlorophenyl]-2,2,2-trichloroethyl)acetamide;
tris[2,3-dibromopropyl]isocyanurate;
2,2-bis[p-chlorophenyl]-1,1-dichloroethylene;
and their isomers, analogs, homologs and residual compounds. The preferred deep UV photoacid generators are those capable of being used at concentrations as low as about 0.1 weight percent when the deep UV exposure dosage is 10 mJ/cm$^2$. The preferred deep UV photoacid generators are DDT, Methoxychlor, Kelthane and tris(2,3-dibromopropyl)isocyanurate.

The photosensitive composition containing the crosslinkable polymer and selected photoacid generator compound are dissolved in a non-reacting solvent. These solvents include glycol ethers such as ethylene glycol monomethyl ether, ethylene glycol monoethyl ether, Propasol ® P, Propasol ® B and the like, Cellosolve ® esters such as methyl Cellosolve ® acetate, ethyl Cellosolve ® acetate and acetates of Propasol B and P and the like, aromatic hydrocarbons such as toluene, xylene and the like, ketones such as methylethyl ketone, cyclopentanone, cyclohexanone and the like, esters such as ethyl acetate, butyl acetate, isobutyl isobutyrate, butyrolactone and the like, amides such as dimethyl acetamide (DMAC) n-methylpyrrolidinone (NMP), dimethylformamide (DMF) and the like; chlorinated hydrocarbons such as ethylene dichloride, chlorobenzene, ortho-dichlorobenzene and the like, nitrobenzene, dimethylsulfoxide, and mixtures of the above.

The photosensitive coating solution contains at least 50 percent by weight solvent and preferably from about 65 to about 95 percent by weight solvent.

Various additives can also be added in minor amounts ranging from about 0.001 percent to about 10 percent by weight on total solids, to the photosensitive composition. The additives may enhance the performance of the coating solution and the resulting coating. They can act as flow and levelizing agents, anti-striation agents, plasticizers, compatibilizing agents and light attenuating and anti-reflective dyes, substances and the like. Alkaline decomposition control can be accomplished by the addition of from about 0.001 to 2 weight percent on solids of weak organic acids such as acetic, propionic, tartaric, malonic, succinic, glutaric, phthalic and the like. Small quantities of water on the order of 0.001 to 1 percent can be added to assist in the decomposition of the exposed photoacid generator and low molecular weight monomeric alcohols, glycol ethers and the like can also be added at concentrations of from about 1 to about 20 weight percent to stabilize aminoplast resins in the photosensitive composition.

The preferred photosensitive compositions useful to prepare microplastic structures using near UV exposure contain from about 3 to about 50 parts by weight of an aminoplast resin, about 90 parts to about 40 parts by weight reactive hydrogen generating compound, and from about 2 to about 30 percent by weight near UV photoacid generator or from about 50 to about 95 percent by weight of a phenoplast resin, from about 40 to about 3 percent by weight formaldehyde generating compound and about 2 to about 30 percent by weight near UV photoacid generator. A more preferred concentration of the near UV photoacid generator is from about 15 to 25 percent by weight. When microplastic structures are desired to be prepared in the negative mode using the minimum amount of deep UV exposure, the preferred photosensitive composition will contain the same concentration of aminoplast or phenoplast resin and reactive hydrogen generating compound or formaldehyde generating compound, respectively, as described above for use in the near UV, but the preferred concentration of the deep UV photoacid generator will range from about 0.1 to about 5 percent by weight.

A photosensitive composition useful for preparing microplastic structures using near UV exposure may be prepared by adding the aminoplast resin to a conventional solution of a novolak resin and near UV photoacid generator. The photosensitive coating solution may then deposited on a substrate surface as a uniform coating having a thickness of from about 0.5 to about 50 microns by conventional techniques such as by spin coating. Suitable substrate surfaces for use with the photosensitive coating solutions with near UV or deep UV exposure through a radiation attenuating photomask include silicon or silicon dioxide coated, aluminum-aluminum oxide or silicon nitride wafers. After the coating is applied to the substrate, the substrate and coating are heated to a temperature of about 90° C. for about 30 minutes to volatilize the solvent ("soft baking"). The touch-tack free coating that results may then be processed in either the positive or negative mode in the near UV or in the negative mode in the deep UV to form three dimensional, aqueously developable, thermally stable microplastic structures.

The thermally stable microplastic structures of the invention may be formed in a negative-or positive manner when the near UV photoacid generators are employed and in the negative mode when the deep UV photoacid generators are used. I have found that when the near UV exposure is employed, it is preferable to form the microplastic structures using the negative mode of action. When the negative mode of action is employed with a photosensitive coating more latitude exists in for the exposure and development parameters needed to prepare highly resolved images than when the positive mode is employed. I have also found that the aspect ratio for the near UV negative image is at least twice that achieveable with the corresponding near UV positive image. For acceptable near UV negative images aspect ratios greater than 3 are easily achieved while in the case of near UV positive images, an aspect ratio of only about 1.6 can be achieved but with difficulty. This means that for a structure of a given height or thickness the width of the near UV negative structure can be half the width of a corresponding positive structure or, for a structure of a given width, the height or thickness of the microplastic structure formed in the negative mode can be more than twice the height of a corresponding positive structure formed from the same photosensitive composition. The preference for the negative mode of action with near and deep UV exposure is a result of the fact that the negative image structure is crosslinked before development while the positive image structure is crosslinked after development. When the image structure is crosslinked before development, the crosslinked image structure is virtually insoluble in the aqueous developer. When the positive mode is employed in the near UV, development of the image structure depends on the relative solubilities of the unexposed and uncrosslinked portion and exposed and uncrosslinked latent image portion of the photosensitive coating. Establishment of optimum exposure conditions, developer type and concentration is, therefore, more difficult and critical for highly resolved near UV positive image structures than when the negative mode of action is employed.

In the negative mode, using the near UV or deep UV photoacid generators, the coating is exposed to the appropriate actinic radiation through a specially designed photomask and heated to from about 70° C. to about 120° C. to crosslink the exposed portion of the coating. The unexposed portions of the coating are then flood exposed (no photomask) to the same actinic radiation and developed and removed using an aqueous base developer. In the positive mode of act ion using the near UV exposure the coating is exposed to the appropriate near UV actinic radiation through the specially designed photomask and the exposed portion of the coating is developed and removed using an aqueous base solution. The previously unexposed portions of the coating are then flood exposed to the appropriate near UV actinic radiation and heated to from about 70° C. to about 120° C., and preferably from about 100° C. to about 125° C., to crosslink the subsequently exposed portions of the coating.

During the course of my experiments with the dual acting, near UV, acid hardening resin-containing photoresists, I observed that when the photoresist is exposed to actinic radiation a concentration gradient of photogenerated acid is established in the coating. This concentration gradient is established in the thickness of the coating, the highest concentrations of photoacid being present in the portion of the coating closest to the source of the actinic radiation and the lowest concentration in the portion farthest away from the radiation source. This observation is in accord with Beer's law since the radiation is attenuated as it passes through the coating thickness. In order to process the dual acting, near UV resist in the positive mode I found it necessary to carefully adjust the amount of exposing near UV radiation to obtain complete conversion of the photosensitive composition in the coating portion in contact with the substrate for subsequent complete removal by the aqueous base developer. Insufficient exposure was found to leave a portion of the resist, namely the resist in contact with the substrate, insoluble in aqueous base developer. Similarly, in the near UV and deep UV negative mode of action in the process of the present invention the exposure dosage must be sufficient to generate sufficient photoacid in the exposed coating portion in contact with the substrate to effectively crosslink the exposed coating. I postulated that if the amount of radiation used to expose the coating was intentionally controlled such that different amounts of radiation are permitted to reach different levels in the coating thickness, it would be possible to selectively manipulate the final thickness of the microplastic structure at any point in the coating as well as pre-selecting its length and width. Once the desired thickness of the microplastic structure is correlated with the minimum dose of exposing actinic radiation needed to generate a sufficient quantity of photoacid in the exposed coating portion in contact with the substrate to crosslink the image upon heating, it would be possible to design a photomask which permits a controlled transmission of a sufficient amount of actinic radiation to reach different levels in the photosensitive coating deposited on the substrate.

Accordingly I had a photomask prepared having areas that permit the transmission of different amounts of exposing radiation. The mask was prepared with partially vacuum metallized "grey" areas that permit the transmission of from about 1 to about 32 percent of the actinic radiation, as well as areas that transmit 100% and 0% of the exposing radiation, to the coating. This attenuation was done in eight steps for each of nine different size patterns on the mask ranging from 1 to 100 times magnification. This resulted in a grid or matrix of patterns or "image clusters" on the mask having various sizes, configurations, and transmission patterns. Using such a mask the amount of actinic radiation used to expose the photosensitive coating can be selectively attenuated to form structures of different, "independently selected" sizes and shapes. The radiation attenuation feature of the photomask is especially useful for manipulating the thickness of a structure. A structure having different thicknesses along its width and length, varying from the full thickness of the deposited photosensitive coating down to a very thin layer on the substrate, can be prepared using the process and a single attenuating mask pattern. By controlling the exposure dosage of actinic radiation it is also possible to form structures with negative or positive sloping side wall profiles as well as with side walls which are vertically perpendicular to the substrate surface. By so designing the side wall profile, it is also possible to form microplastic structures which can be easily lifted off from the substrate.

In the case of the negative mode and top imaging, as described in more detail hereinafter, I found it possible to form tunneled structures since the areas of the coatings completely exposed to actinic radiation became crosslinked from the top of the coating down to the coating/substrate interface, while in partially exposed areas only those coating areas receiving a sufficient dosage were capable of being cross linked at all. As long as there are adequately exposed and crosslinkable coating areas adjacent to partially (insufficiently) or unexposed coating areas it is possible to form hollow, undercut or tunneled structures. In the case of the near UV positive mode, with top imaging, it was possible to form intaglio, relief, or recessed images below the top surface of the coating.

If the substrate itself is capable of transmitting actinic radiation and the radiation attenuating photomask is placed beneath the substrate or the photosensitive coating is deposited on the bottom substrate surface, instead of on the top side or side closest to the exposing radiation, exposure of the coating through the mask and substrate can be used to form an inverted image since the concentration gradient of photoacid in the coating is inverted.

The radiation attenuating photomasks used in my experiments are illustrated in FIGS. 1–3. The photomask was prepared with a light margin design (FIG. 2) and a dark margin design (FIG. 3). When the near UV positive mode of action is desired, the margin areas in the photomask are made transparent to the exposing radiation (light margin design) so as to cause the resulting microplastic structures to be isolated from one another. When a negative mode of action is desired, such as with the near or deep UV photoacid-containing photosensitive compositions, the margin areas in the photomask are made opaque to the exposing radiation (dark margin design) to isolate the microplastic structures produced. The selection of the proper margin design permits the resulting microplastic structure to be easily isolated from the surrounding portions of the photosensitive coating. In the light margin design the spaces between each image pattern permits the transmission of 100% of the exposing radiation, while in the dark margin design the spaces between each image pattern is opaque to the exposing radiation (0% transmission). With these two photomask designs (light and dark margin area) it is possible to prepare structures and their inverse structures in the near UV using one photosensitive composition and a single mode (positive or negative) of operation.

FIGS. 2 and 3 illustrate the image matrix or "cluster" on the radiation attenuating photomask used in my experiments. Patterns in the first row, first and third columns are referred to as "checkerboards"; the pattern in the first row, second column is referred to as a "cantilever beam"; the patterns in the second row, first column and third row, second column are referred to as "tunnels"; the pattern in the second row, second column is referred to as "penta"; the pattern in the second row, third column is referred to as an "overhung projection"; and the patterns in the third row, first and third columns are referred to as "bullseyes".

FIG. 1 provides a map of the 8×8 quartz 3 photomask with vacuum deposited images. The column indicates the differing degrees of actinic radiation transmission while the rows identify image clusters of different sizes. The prefix sign identifies whether the structure was prepared in the positive (+) or negative (−) mode. For example the nomenclature "−6,5" refers to a negative mode structure produced at 25 times magnification and 16% transmission. Each row and column in the matrix contains a full 3×3 image cluster.

Top and Bottom Imaging (FIGS. 4A and 4B, respectively)

A photoresist is generally applied as a coating to the surface of a silicon wafer and exposed to actinic radiation through a photomask 14. The photomask is typically positioned between the source of the actinic radiation 13 and the photosensitive coating at the coating/air interface (topside) rather than the substrate/air interface (bottomside). This first type of exposure is referred to herein as "top" imaging since the portion of the coating furthest from the substrate 11 surface is the first portion contacted by the exposing radiation.

If an actinic radiation transparent substrate 12, such as for example an ultraviolet light transparent quartz disk, is used as a substrate it is possible to project an image through the substrate such that the portion of the coating on the substrate closest to the substrate and farthest from the coating/air interface is exposed first. This type of exposure is referred to herein as "bottom" imaging.

If the identical photomask is used to prepare structures by top imaging and by bottom imaging, the structure formed by top imaging will be the inverse of the structure formed by bottom imaging; only the side wall profile of the structures being different.

Figure 7:
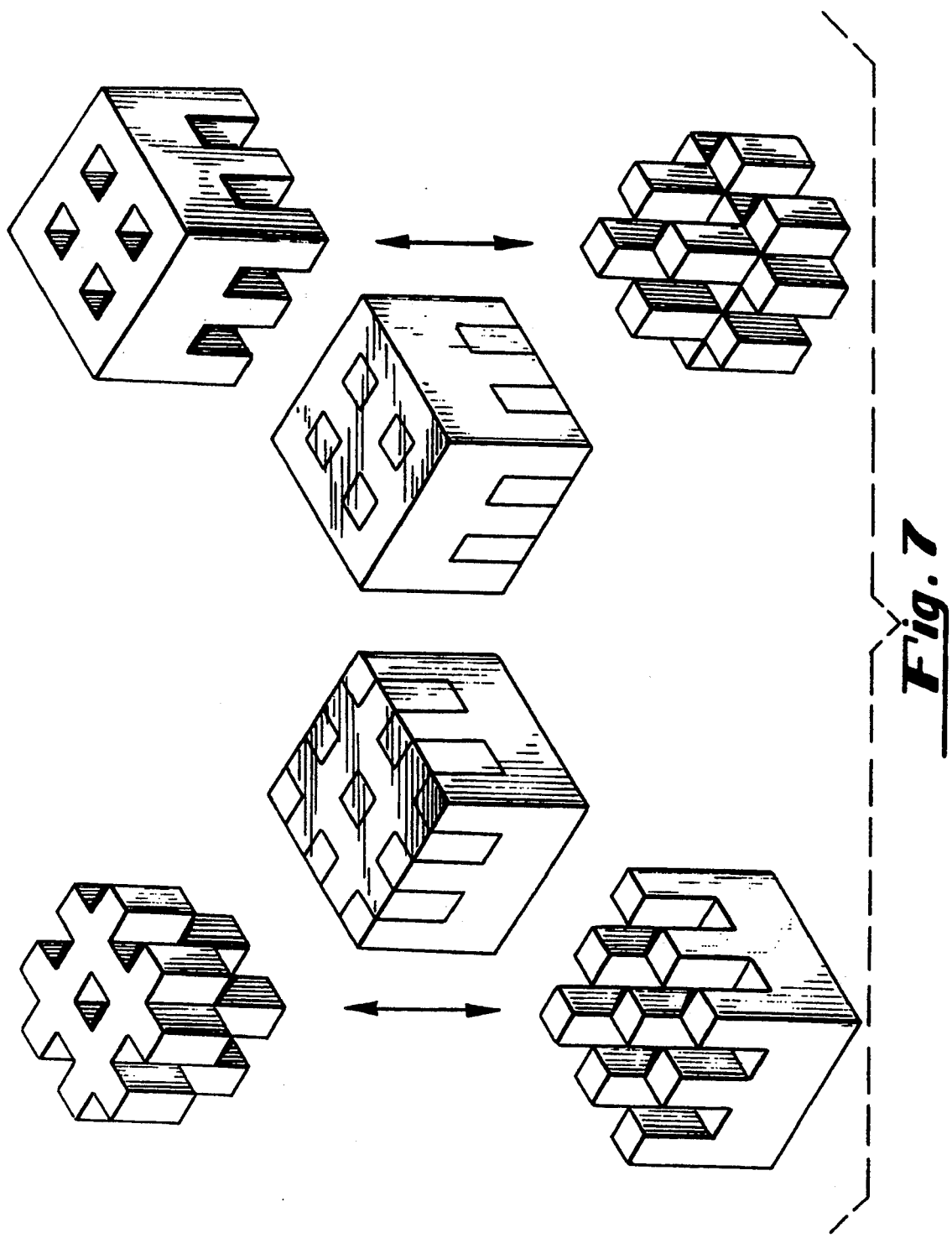
FIG. 7 illustrates how the checkerboard structures of FIGS. 5 and 6 fit together to form a solid cube.

FIGS. 5 and 6 illustrate two checkerboard patterns A and B, respectively for the light attenuating photomask. If pattern A were projected on the surface of a silicon wafer in the negative mode (light margin) the structure produced would be as shown in FIG. 5 (top-left); while if pattern A were projected in the near UV positive mode, the structure produced would be as shown in FIG. 5 (top-right). If these structures were separated from their substrates and placed together, they would fit together to form a completely filled solid cube as shown in FIG. 7.

Figure 8:
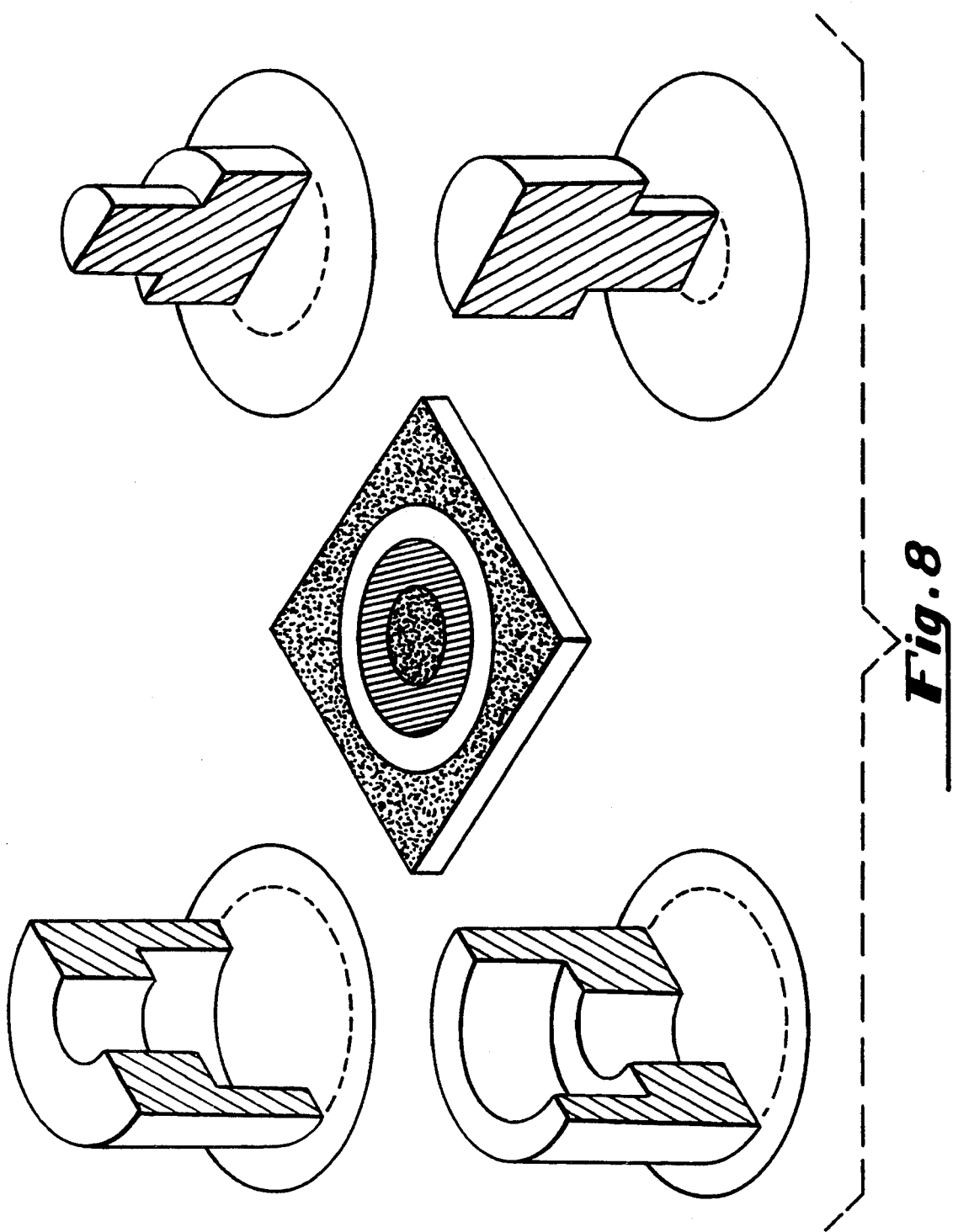
FIG. 8 illustrates the bullseye mask (dark margin) and the four microplastic structures resulting therefrom.
Figure 9:
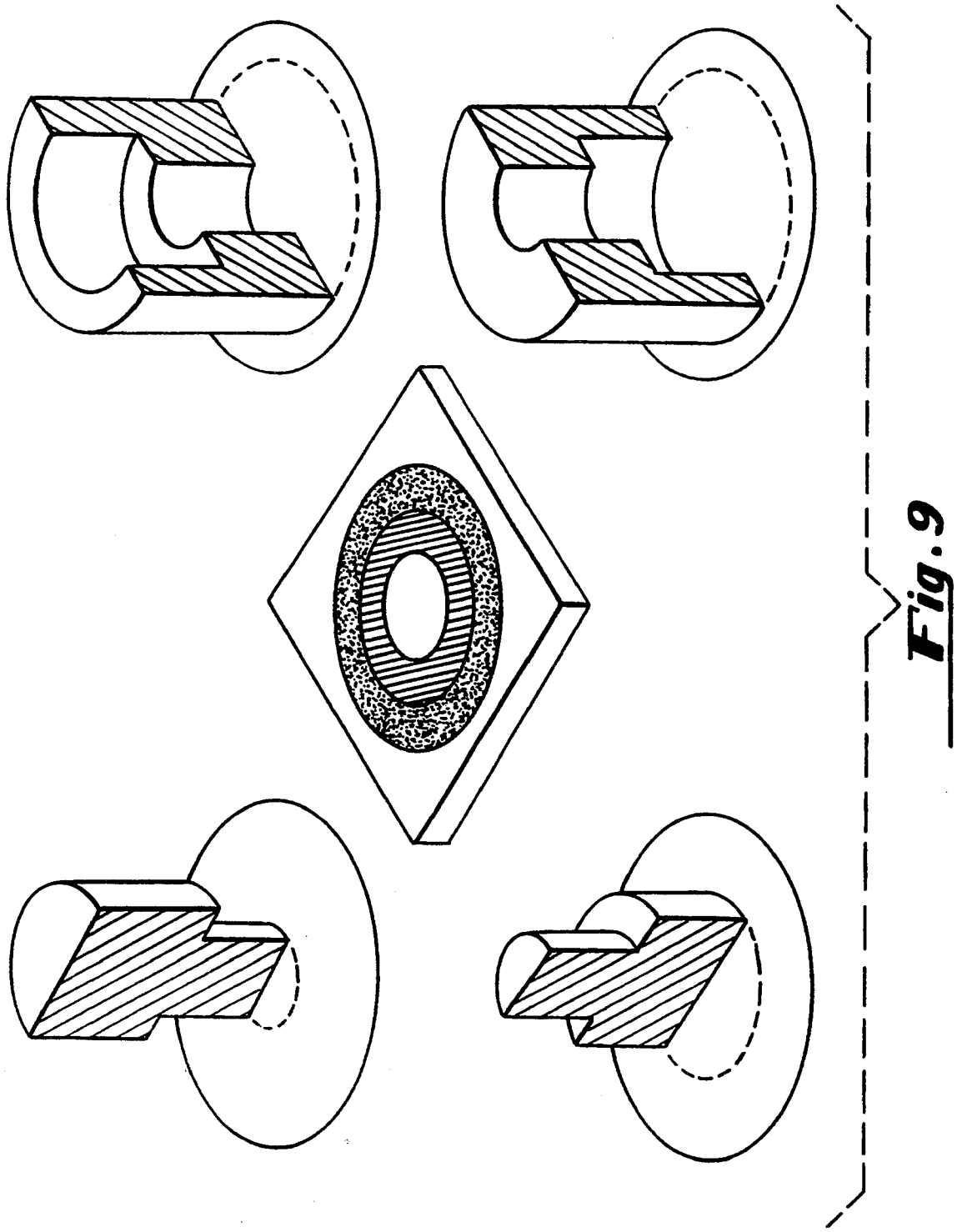
FIG. 9 illustrates the bullseye mask (light margin) and the four microplastic structures resulting therefrom.
Figure 10A:
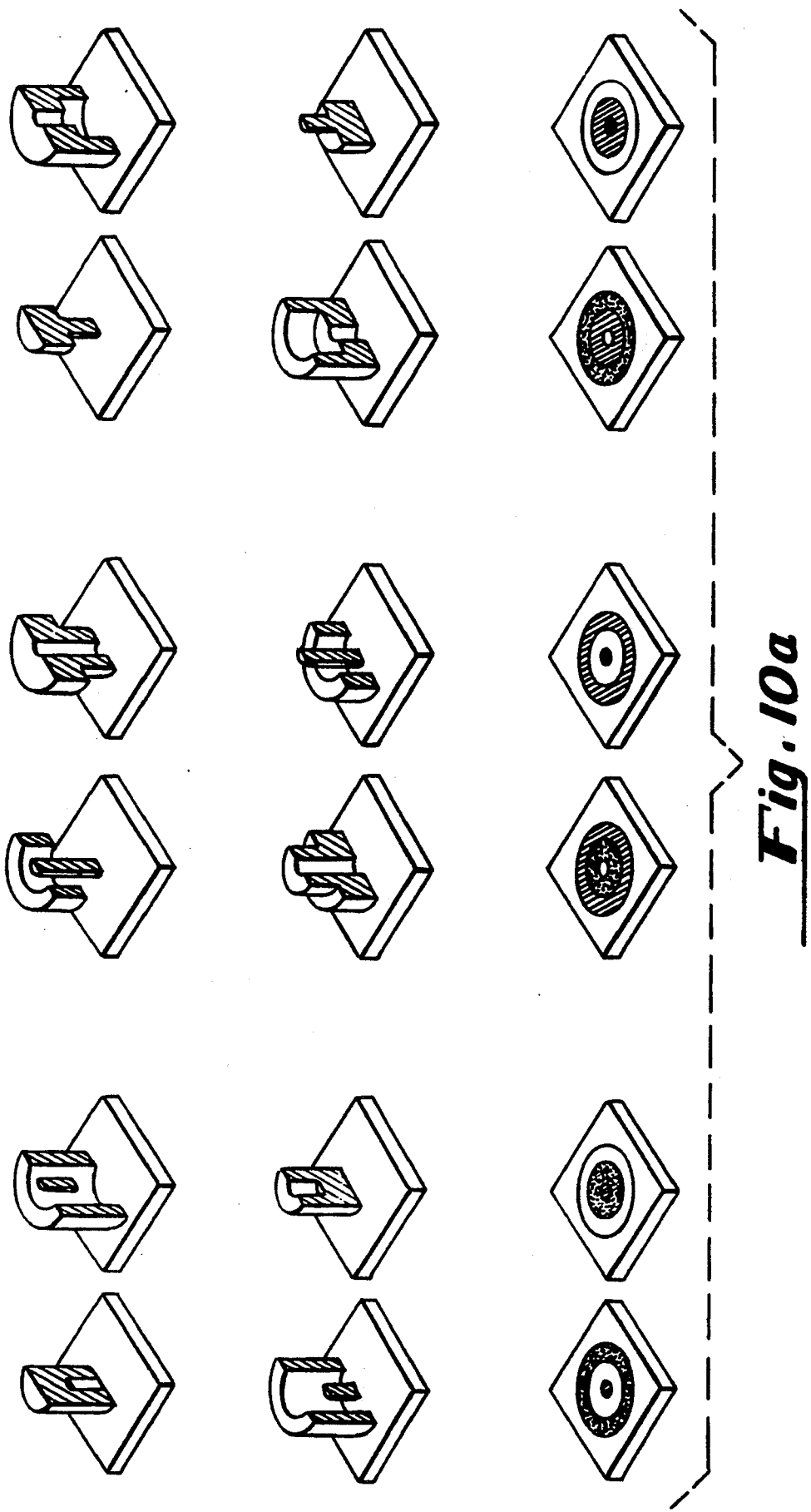
FIG. 10 illustrates other bullseye mask patterns and microplastic structures prepared therefrom.

FIGS. 8 and 9 illustrate the four image structures (upper left - top imaging negative; upper right - top imaging positive; lower left - bottom imaging negative; and lower right - bottom imaging positive) formed using the bullseye pattern (dark margin) and the four image structures which can be formed from the center bullseye pattern (light margin). Other top and bottom imaged three ring bullseye image structures which could be formed using a light attenuating photomask pattern and the dual image able, near UV photosensitive composition are illustrated in FIG. 10.

Figure 11:
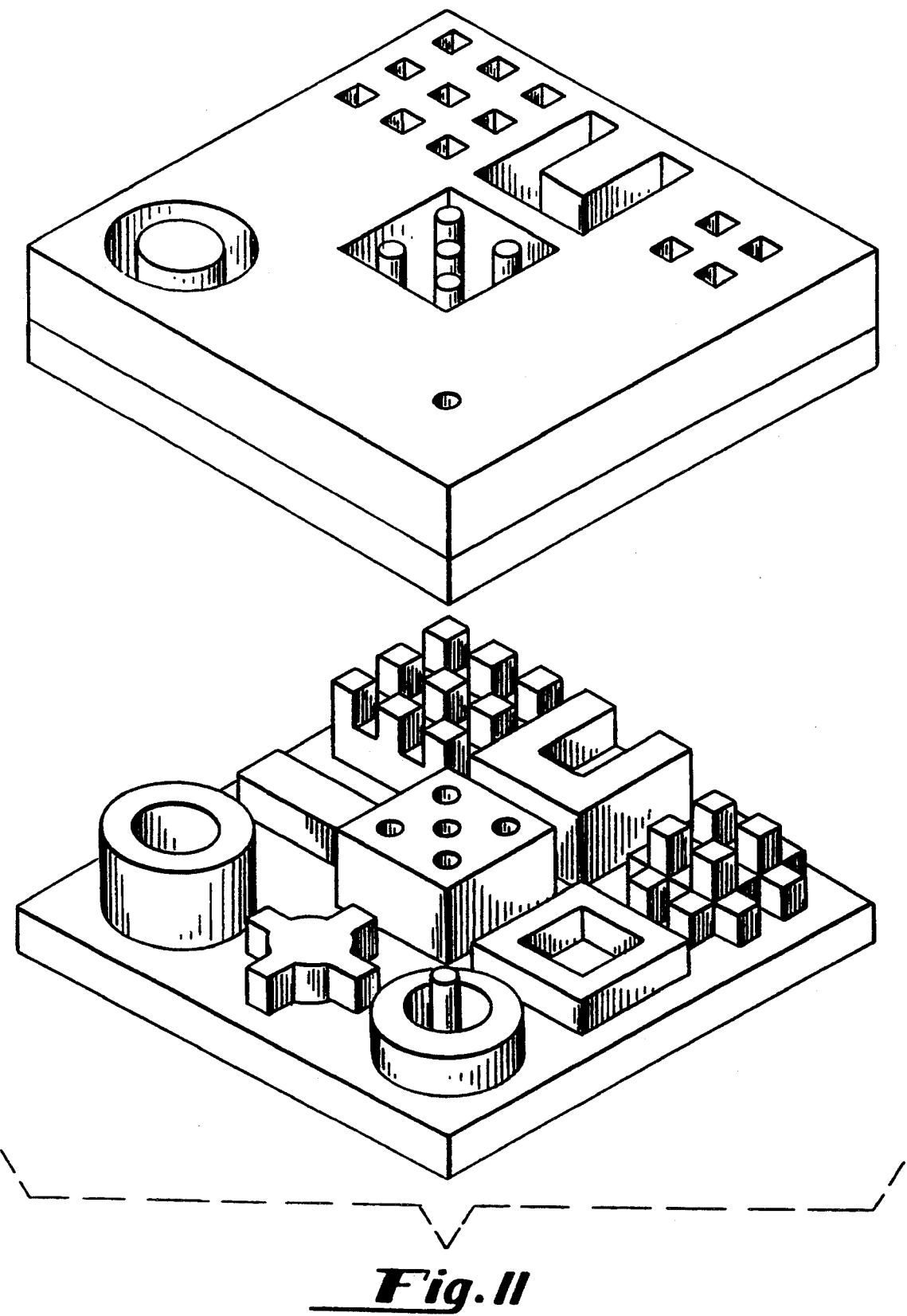
FIG. 11 illustrates the microplastic structures formed from the image cluster light margin photomask of FIG. 2.
Figure 12:
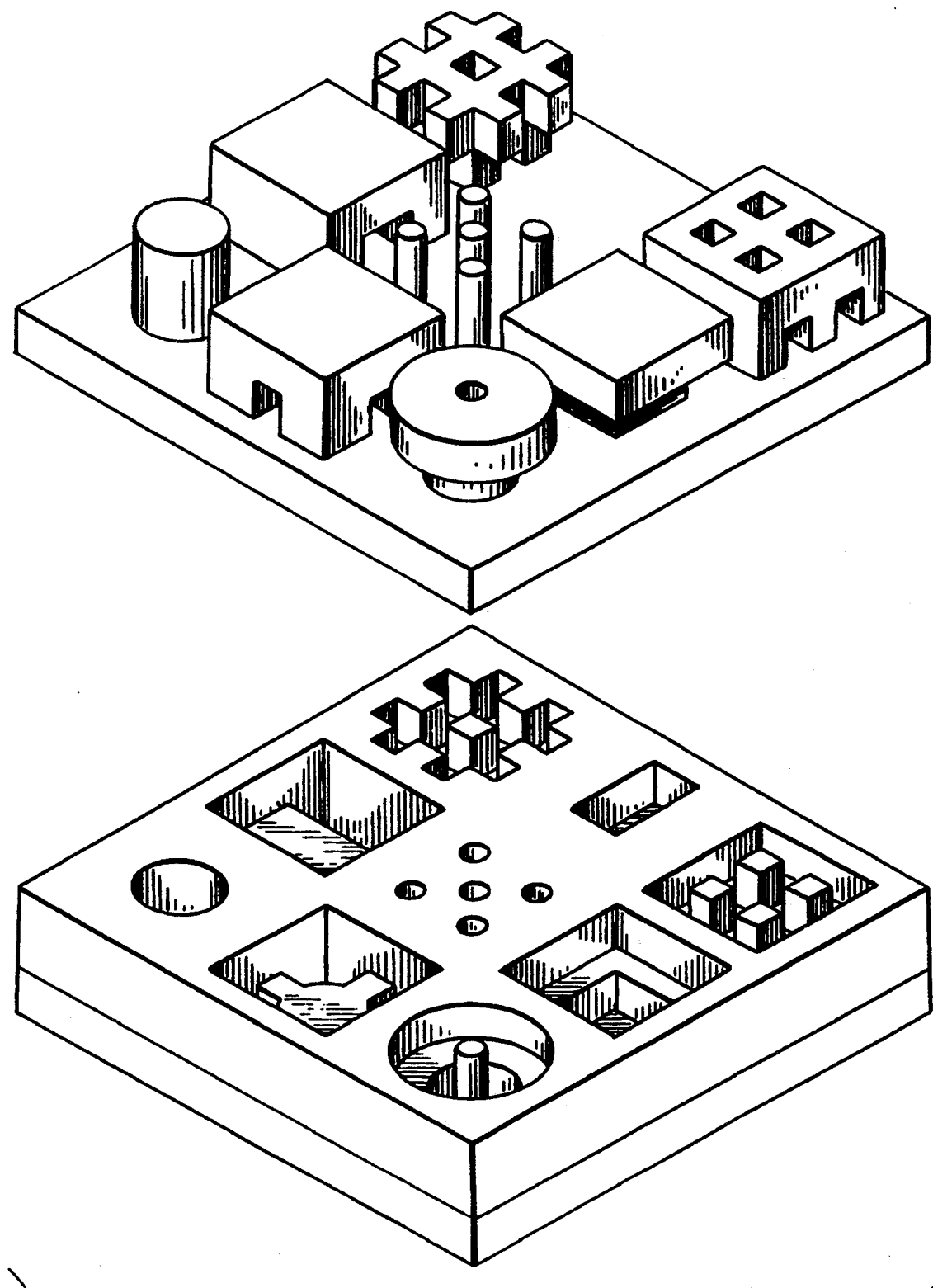
FIG. 12 illustrates the microplastic structures formed from the image cluster dark margin photomask of FIG. 3.

FIG. 11 illustrates all the image clusters negative (upper) and positive (lower) formed by top imaging a dual image able photosensitive coating of 12 microns in thickness using a light margin attenuated photomask, while FIG. 12 illustrates the image clusters formed by top imaging the dual image able photosensitive coating of 12 microns in thickness using a dark margin attenuated photomask.

The dual image near UV, photosensitive coating composition is preferably used in conjunction with the light attenuating photomasks to produce microplastic structures. These structures were capable of being prepared in both the negative and positive modes at all sizes and percent transmittance of the 8×8 matrix. For each size image cluster, type of photosensitive composition, coating thickness, radiation source aria processing parameters, there is one optimum exposure condition. Other image clusters, receiving more or less of the exposing radiation, will be over or under exposed, respectively. Identical structures could be made from more than one traditional (opaque/transparent only) photomasks by the use of sequential exposures of similar and different intensity actinic radiation to create the same latent image as that created by one exposure through the attenuating mask. The attenuating mask is also particularly useful in defining the useful exposure dose needed for defining the desired vertical dimension in the image.

The negative image structures formed using the radiation attenuating mask were found to be more easily prepared than the positive image structures because of difficulties in establishing the proper exposure for positive image structures as well as the inherent limitations on solubility resulting from processing uncrosslinked exposed and unexposed coating portions. Since the negative image microplastic structures are crosslinked prior to development the resulting structures are virtually insoluble in the aqueous developer and are more easily processed. In preparing the microplastic structures using the near UV photosensitive compositions, I found that the negative mode of action produced images of higher aspect ratios than when the positive mode is employed. I also found that the positive mode resulted in structures having peaks and valleys in the structure surface. I believe that these peaks and valleys are the result of standing waves produced by internal reflections of the exposing radiation within the structure. These reflections are believed to result in reenforcement and nullification of the radiation pattern resulting in the peak and valleys. The extent of these surface irregularities are very slight but become more noticeable in the positive mode as the aspect ratio is increased. When the negative mode of action is employed these standing wave irregularities are not as pronounced as in the corresponding positive mode of action using near UV exposure.

I have also found that when thick structures, on the order of about 15 to about 50 microns in thickness, are desired to be produced using the photosensitive compositions in the positive mode it is preferable to use a photoacid generator which does not generate nitrogen gas upon exposure. When photoacid generators which generate nitrogen gas upon exposure are employed with the positive acting, near UV photosensitive coatings of the invention to form thick microplastic structures, the nitrogen gas formed upon exposure forms bubbles which become trapped in the structure. It appears that the dissolved nitrogen gas diffuses slowly from the structures into the air at ambient temperatures. If the structure is heated too rapidly during the final baking step, the nitrogen bubbles form and interfere with the dimensional integrity of the resulting structure.

It is possible to construct microplastic structures by placing structures on top of previously formed structures using the same or different photosensitive composition and conventional photomasks having different patterns. FIG. 14 illustrates a five level microplastic structure which can be formed from the photomask patterns illustrated in FIG. 13 using the negative acting near UV photosensitive composition.

I have also found that it is possible to use the microplastic structures of the invention as mandrels or forms onto which metals can be electrolessly plated or vacuum deposited. Once the structures are so plated, the microplastic structure, used as the mold or form, can be removed, such as by chemical action or by heating in air at elevated temperatures, leaving only the metallic form on the surface. The structures could be used as molds for casting metals, glasses or polymerizable resins or as forms or mandrels which can be electroimmolated or electroformed. The microplastic structures, therefore, can be used to prepare lenses and prisms for optical or solar devices; for attaching optical fibers over light sensitive electronics; as orifices to control the flow of gases or liquids to a chemical sensor; for a chromatographic column over a thermally conductive detector; as a structure to retain materials such as, for example, ionic gels over a chemical sensor; or as a reactive structure, which for example could contain excess amino resin such as for subsequent reaction with biomaterials such as enzymes, antibodies, or containing other chemicals as part of a chemical sensor. Vacuum metallizing the surface of the microplastic structure containing reactive sites could leave the reactive sites in the structure for subsequent reactions. If the structure is deposited on a surface containing a soluble polymer coating, such as a coating of a polyvinyl alcohol, free standing crosslinked microplastic structures can be prepared. These freestanding structures could be used as a size and/or shape selective filtration device or as a filtration media for trapping chemicals or microorganisms of a specific size or configuration. By selecting the crosslinkable polymer, such as an acid hardening resin system, based on its known physical, electrical or optical properties such as, for example, modulus of elasticity, electron flow resistance, refractive index or reactivity towards a specific chemical, the microplastic structures of the invention can be tailor-made for specific end use applications.

The following examples are intended to illustrate the capability of the photosensitive compositions of the invention to form three dimensional, thermally stable, microplastic structures using near and deep UV exposing radiation with a radiation attenuating photomask. The structures so formed are illustrative only and should not be interpreted as constituting any limitation on the configurations which could be prepared using the photosensitive compositions and techniques described herein.

Example 1 - Positive and Negative Image Structures on a Silicon wafer using a dual Near UV image photoresist To 30 grams of a 27 percent by weight (solids) photosensitive mixture, (Shipley Company Microposit 1470 photoresist), consisting of a novolak resin and a diazonaphthoquinone photoacid generator dissolved in a suitable organic solvent system (Shipley Microposit thinner), was added 1.62 grams of melamine-formaldehyde resin (Cymel 303). The photosensitive coating solution was stirred at 25° C. until a homogeneous solution was formed. The surface of a 3 inch diameter silicon oxide coated wafer was vapor primed (minimum of 5 minutes) with hexamethyldisilazane (HMDS) to remove surface moisture. The coating solution was then either spin coated or dip-coated onto the wafer surface. To spin coat, 1.0 ml of coating solution was spun onto the wafer at 500 rpm for 5-7 seconds to form a 5 micron thick coating. A second 1.0 ml of the coating solution was then placed onto the surface of the first layer by spinning at 500 rpm for an additional 5-7 seconds. This second coating step was to form a final coating of about 10 micron in thickness. After the coating was deposited, it was soft baked at 90° C. for 30 minutes to remove the solvent from the coating. To dip coat, about 20 ml coating solution was placed in the bottom of a Petri dish and the primed wafer was immersed, polished side up, in the coating solution. The wafer was then drained and allowed to air dry at 25° C. for 1 hour and then heated ("soft baked") at 90° C. for 0.5 hours.

1) Formation of Positive Image

The wafer in contact with the metallic images of the 3D Image Cluster Mask, (light margin) was exposed to broadband actinic radiation of 365 nanometers (nm) from a high pressure mercury vapor lamp at a dose of 2300 millijoules per square centimeter ($mJ/cm^2$). A Hybrid Technology Group Model No. L84-5X contact printer with a 500 watt mercury vapor lamp was used. The wafer was developed with Shipley Company Microposit 351 Developer, a proprieary mixture of strong aqueous bases, diluted one part by volume with five parts by volume of aleionized water, for 9.0 minutes at 20° C. with agitation. The resulting images were approximately 11.0 microns thick.

The smallest highly resolved image cluster was found at position +5,2. A small amount of unexposed film loss occurred, as evidenced by "ridges" along the image sidewalls, due to the fact that the unexposed film has a finite solubility in the developer (about less than two Angstroma/sec.). To form microplastic structures, the images were then flood exposed at 365 nm, using the lamp described above, at a dose of 2000 $mJ/cm^2$. The wafer was then heated in a forced air oven for 92 hours at 75° C. and then the temperature was raised to 175° C. in 5 equal time increments of over 30 minutes. The wafer was finally placed in a 190° C. forced air oven for 120 minutes before finally heating at 300° C. in a high temperature furnace for 15 minutes. No significant loss in image quality was observed in scanning electron micrographs of images before and after heating to 300° C.

2) Formation of Negative Image Structure

The coated wafer was placed in contact with the light margin 3D Image Cluster Mask and exposed to 3000 $mJ/cm^2$ of 365 nm radiation using the lamp and printer described above. The imaged wafer was soft baked in a forced air oven for 30 minutes at 90° C. It was then flood exposed with 1500 $mJ/cm^2$ of 365 nm radiation. The image was developed at 20° C. in a 3:1 diluted solution of Shipley Microposit 351 Developer and deionized water for 10.0 minutes with mild agitation. The resulting images were about 8.0 microns ($\mu$m) thick.

The smallest highly resolved image cluster was found at position −5,1. The image was then heated 44 hrs. at 90° C. in an oven and then for 15 minutes at 300° C. No loss in image quality occurred during this heat treatment.

Example 2 - Deep UV Negative Image Structures a) 1% 1,1-bis (p-chlorophenyl)-2,2,2-trichloroethane Deep UV Photoacid Generator To 15.0 grams of a proprietary novolak resin, Shipley Company XP-0103 at 30% solids in Shipley Microposit thinner, was added 0.92 grams Cymel 303 and 0.055 grams 1,1-bis (p-chlorophenyl)-2,2,2-trichloroethane (Aldrich Chemical). The photosensitive coating solution, containing 1% of the deep UV photoacid generator on weight of total solids, was stirred for 15 minutes until a homogeneous solution was formed. The solution was then spin coated onto an HMDS vapor-primed 3 inch diameter silicon oxide wafer at 3000 rpm for 60 seconds. The coated wafer was then soft baked for 30 minutes in a forced-air oven at 90° C. to remove solvent. It was then placed in contact with the 3D Image Cluster Mask. A 2 inch square bandpass filter, from Action Research Corporation, was placed between the mercury vapor lamp and the mask. The filter had a peak wavelength of 248.5 nm, a center wavelength of 255.8 nm, and a bandwidth of 42.5 nm. The wafer was exposed to the filtered actinic radiation of about 256 nm at a dose of 60 $mJ/cm^2$ using the lamp and printer described in Experiment 1. The wafer was then heated in a forced air oven for 30 minutes at 90° C. After cooling to ambient temperature the negative image structure was developed in Shipley Microposit 351 Developer 2:1 diluted with aleionized water for 4.5 minutes to give a 1.6 $\mu$m thick structure. The smallest resolved image cluster was found at position −6,1.

b) 10% 1,1-bis(p-chlorophenyl)-2,2,2-trichloroethane

To 40.0 grams of the previously described novolak resin, was added 2.4 grams of Cymel 303 and 1.4 grams 1,1-bis(p-chlorophenyl)-2,2,2-trichloroethane. Example 2(a) was repeated for the 10% 1,1-bis(p-chlorophenyl)-2,2,2-trichloroethane solution, by exposing to 30 $mJ/cm^2$ at 256 nm and developing in a 1:1 diluted Shipley 351/deionized water developer for 7.5 min.

The smallest resolved image cluster was at position −4,1 (2.8 $\mu$m).

Example 3 - Deep UV Resist-Thick Negative Image Structures Produced from Halogen Acid Generators a) 5% 1,1-bis(p-chlorophenyl)-2,2,2-trichloroethane To 12.0 grams of the previously described novolak resin solution (example 1) was added 0.77 grams Cymel 303 and 0.22 grams 1,1-bis(p-chlorophenyl)-2,2,2-trichloroethane. The mixture was stirred for 30 minutes until a homogeneous solution was formed. The coating solution containing 5% by weight deep UV photoacid generator was spin coated onto an HMDS vapor-primed (5 minutes) 3 inch silicon oxide wafer at 1000 rpm for 90 seconds. The coated wafer was soft baked at 90° C. in a forced air oven for 15 minutes before application of a second layer of resin. The wafer was cooled to ambient temperature before the second layer was spin-coated on top of the first layer at 1000 rpm for 60 seconds. The wafer was then dried soft baked in a forced air oven at 90° C. for 40 minutes to remove solvent. The coating was exposed to 150 $mJ/cm^2$ at 256 nm deep UV from the high pressure mercury vapor lamp, using the bandpass filter, printer, and 3D Image Mask described in Example 2(a). The wafer was then heated at 90° C. for 30 minutes. The image was developed in neat Shipley 351 Microposit Developer (no dilution with deionized water) for 3.0 minutes.

The smallest resolved image cluster (8.9 μm) was found at position —4,2.

2) 3% tris(2,3-dibromopropyl)isocyanurate

To a mixture of 12.0 g of the previously described novolak resin solution was added 0.77 g of Cymel 303 and 0.20 grams tris(2,3-dibromopropyl)isocyanurate (Aldrich Chemical, 97%) and the mixture was stirred over night at room temperature at which time a homogeneous solution was found. The coating, containing 5% by weight deep UV photoacid generator, was applied to a wafer and baked as described in Example 3(a). The 8.7 μm thick coating was exposed to 200 mJ/cm$^2$ actinic radiation of 256 nm using the same procedure as Example 3(a), and developed for 7.0 min. in a 1:1 Shipley 351/deionized water developer solution.

The smallest highly resolved image cluster was position —6.2.

3) Thermally Stabilized Images

Thermally stable negative images were prepared by placing the developed wafers of Experiment 2 in a forced air oven at 90° C. for 24 hours to remove products of the acid hardening crosslinking reaction such as alcohol and water. After heating at 110° C. for 20 min. the wafers were then heated to 140° C. for 45 minutes and then to 190° C. for 20 minutes. They were then placed in a 300° C. furnace for 15 minutes to demonstrate thermal stability.

No significant loss in image quality was observed in the SEM's of the images before the after heating to 300° C. The hollow and undercut structures remained intact.

Example 4 - Resists with Onium Salt Sensitizers Thin Negative Images Produced with Onium Salt Sensitizers in the Deep UV 1) UVE-1014 Sensitizer To 8.33 grams of the novolak resin solution described in Experiment 2 was added 0.49 grams Cymel 303 and 0.27 grams of a proprietary onium salt photosensitizer, (General Electric UVE 1014). The coating containing 4% sensitizer (based on 50% sensitizer solids) was spin coated onto a primed wafer at 2500 rpm for 60 seconds, then baked at 90° C. for 30 minutes. The coated wafer was placed in contact with the 3D Image Cluster Mask and exposed to 40 mJ/cm$^2$ at 256 nm, using the filter and printed described in Example 1. The wafer was baked at 90° C. for 30 minutes, and then developed in a 1:1 Shipley 351 developer/deionized water for 4.25 minutes to produce a 3.0 μm image. The smallest resolved image cluster was position —8,1. Structures heated to 300° C. for 15 minutes remain dimensionally stable.

2) FC-508 Sensitizer

A resist containing a proprietary onium salt sensitizer (3M Company FC-508), was prepared in the same manner as above, and the coated wafer was processed in the same way. The image was developed for 4.5 minutes in 1:1 diluted Shipley 351/deionized water developer to produce 2.8 μm images. The smallest resolved image cluster was position —8,1.

3) Thermal Stability

Thermally stable structures resulted after heating the structures formed in Example 4 (1) and 4 (2) from the according to the procedure used in Example 3. No loss in image quality was seen by SEM analysis.

Example 5 - Thick Negative Image Structures Produced from UVE-1014 in the Deep UV A thick (about 10 micron) coating containing the UVE-1014 photosensitizer was coated onto a silicon wafer using the coating solution from Example 4 (1) and the coating method described in Example 3. The dried film was exposed to 150 mJ/cm$^2$ at 256 μm using the same mask, lamp, filter and printer as in Example 1. After a 90° C., 30 minute postbake, the wafer was developed in a 0.5:1 diluted Shipley 351/deionized water developer for 7.2 minutes to give 9.6 μm thick images. The smallest resolved image cluster was position —3,2.

Example 6 - Thick Positive Image Structures from Shipley 1470 Photoresist (Comparative Example)

A thick film of Shipley Microposit 1470 photoresist was double spin coated onto an HMDS vapor primed wafer (as described in example 1) and air dried for 1.5 hours at ambient temperature. The film was then soft baked at 90° C. for 30 minutes, and then exposed through the Image Mask to 2000 mJ/cm$^2$ at 365 near UV nanometers. The exposed areas of the film were developed in a 5:1 diluted Shipley 351/deionized water developer for 3.75 minutes to produce 12.0 μm thick images. The smallest resolved image cluster was position +4.2. The resulting images showed a loss of resolution, such as by loss of sharp edges, when heated at 90° C. for 30 minutes and then slowly to 120° C. over 30 minutes. The images were not thermally stable.

What is claimed is:

1. A process of forming a thermally stable microplastic structure from a photosensitive coating on a substrate surface, said microplastic structure having different selected thicknesses along its width and length, which process allows the selective manipulation of the final thickness of the microplastic structure at any point to any of at least two thicknesses in stepped transitions which comprises:

a) depositing a photosensitive coating composition on a surface, said photosensitive coating composition comprising acid-hardening resin consisting essentially of from about 40 to about 99.9 weight percent of a crosslinkable polymer and from about 0.1 to about 60 weight percent of a photoacid generator, wherein said photoacid generator when exposed to an effective amount of actinic radiation produces an amount of acid effective to make said crosslinkable polymer crosslink upon heating to a temperature of from about 70 to about 120 degrees C.; then b) selectively exposing the layer of photosensitive coating to a controlled transmission of a sufficient amount of actinic radiation to reach different levels in the photosensitive coating deposited on the substrate to selectively manipulate the final thickness of the microplastic structure at different points on the surface of the resist to form a pattern composed of dark and light regions, and at least one region of an intensity between light and dark;

c) controlling the duration of said exposing step so that the areas of the image that align with the light regions receive an amount of radiation effective to generate an effective amount of acid from the surface of the resist to a selected maximum depth in the resist, the areas of the image that align with the dark areas receive an effective amount of radiation to generate an effective amount of acid from the surface of the resist to a selected minimum depth in the resist and the areas of the image that receive attenuated amounts of radiation receive an effective amount of radiation to generate an effective amount of acid from the surface of the resist to a depth between the selected maximum and minimum depths;

d) heating the resist to a temperature of from about 70 to about 120 degrees C. to crosslink the polymer in those regions that contain an effective amount of acid; and e) contacting the coating with aqueous solution to remove the uncrosslinked portions of the coating and thereby form the thermally stable microplastic structure on the substrate surface.

2. A process of forming a thermally stable microplastic structure from a coating of resist on a surface using near ultraviolet radiation, said microplastic structure having micron size dimensions and being isolated from surrounding areas of coating by essentially clear areas on the substrate, and having different selected thicknesses along its width and length, which process allows the selective manipulation of the final thickness of the microplastic structure at any point to any of at least two thicknesses in stepped transition which comprises:

a) depositing a photosensitive coating composition on a surface, said photosensitive coating composition consisting essentially of from about 40 to about 99.9 weight percent of a crosslinkable polymer and from about 0.1 to about 60 weight percent of a photoacid generator, wherein said photoacid generator when exposed to an effective amount of near ultraviolet radiation produces an amount of carboxylic acid effective to make said crosslinkable polymer:
  i) more soluble in aqueous solution and
  ii) crosslink upon heating to a temperature of from about 70 to about 120 degrees C.; then b) selectively exposing a layer of resist to at least three different intensties of near ultraviolet radiation at different points on the surface of the resist to form an image that contains a pattern composed of dark and light regions, and at least one region of an intensity between light and dark, said pattern having a margin of dark region;

c) controlling the duration of said exposing step so that the areas of the image that align with the light regions receive an amount of radiation effective to generate an effective amount of acid from the surface of the resist to a selected maximum depth in the resist, the areas of the image that align with the dark areas receive an effective amount of radiation to generate an effective amount of acid from the surface of the resist to a selected minimum depth in the resist, and those areas of the image that receive attenuated amounts of radiation receive an effective amount of radiation to generate an effective amount of acid from the surface of the resist to a depth between the selected maximum and minimum depths; then d) contacting the coating with aqueous solution to remove the exposed areas to the depths that have become more soluble in the solution due to presence of an effective amount of acid, leaving those parts of the coating that do not contain an effective amount of acid; then e) exposing the coating to a sufficient amount of near ultraviolet radiation to generate an effective amount of acid in the remaining areas of the resist; and f) heating the resist to a temperature of from about 70 to about 120 degrees C. to crosslink the polymer and thereby form the thermally stable microplastic structure on the substrate surface.

3. A process according to claim 1 wherein the substrate is opaque, the exposure step is a top-side imaging step, and the microplastic structures have nearly straight-wall profiles.

4. A process according to claim 2 wherein the substrate is opaque, the exposure step is a top-side imaging step, and the microplastic structures have nearly straight-wall profiles.

5. The process of claim 1 where the photosensitive coating composition comprises from about 3 to about 50 weight percent of an aminoplast resin, from about 90 to about 40 weight percent of a reactive hydrogen containing compound and from about 2 to about 30 weight percent of photoacid generator sensitive to actinic radiation in the near UV, and where said actinic radiation used to expose said coating is near UV radiation.

6. The process of claim 1 were the photosensitive coating composition comprises from about 50 to about 95 percent by weight of a phenoplast resin, from about 40 to about 3 weight percent of a formaldehyde generating compound and about 2 to about 30 weight percent of a photoacid generator sensitive to actinic radiation in the near UV, and where said actinic radiation used to expose said coating of is near UV radiation.

7. The process of claim 1 where the photosensitive coating composition comprises from about 95 to about 99.9 weight percent acid hardening resin system and from about 0.1 to about 5 weight percent photoacid generator sensitive to actinic radiation in the deep UV, and where said actinic radiation used to expose said coating is deep UV radiation having an exposure dosage of about 10 millijoules per square centimeter of coating.

8. The process of claim 7 where the deep UV photoacid generator is selected from a halogenated organic compound which:
   (a) is compatible with the acid hardening resin system and photosensitive coating dissolved in a suitable solvent;
   (b) does not phase separate from the acid hardening resin system when the coating is heated:
   (c) is developable in aqueous base developer
   (d) is non reactive with the substrate and acid hardening resin system before exposure to deep UV and after exposure to deep UV but before heating to a temperature sufficient to crosslink the coating;
   (e) is capable of crosslinking the acid hardening resin system in the portions when exposed to a sufficient dosage of deep UV radiation; and
   (f) which is substantially less volatile than the solvent used with the acid hardening resin system.

9. The process of claim 8 wherein the deep UV photoacid generators are selected from the group consisting of
   1,1-bis[p-methoxyphenyl]-2,2,2-trichloroethane
   1,2,5,6,9,10-hexabromocyclodecane;
   1,10-dibromodecane;
   1,1,-bis[p-chlorophenyl]-2,2-dichloroethane;
   4,4,'-dichloro-2-(trichloromethyl)benzhydrol; or
   1,1-bis[chlorophenyl]2,2,2-trichloroethane hexachlorodimethyl sulfone;
   2-chloro-6-(trichloromethyl)pyridine;

0,0-diethyl-0-(3,5,6-trichloro-2-pyridyl)phosphothioate 1,2,3,4,5,6-hexachlorocyclohexane;

N(1,1-bis[p-chlorophenyl]-2,2,2-trichloroethyl)acetamide;

tris[2,3-dibromopropyl]isocyanurate;

2,2-bis[p-chlorophenyl]-1,1-dichloroethylene;

and their isomers, analogs, homologs and residual compounds.

10. The process of claim 8 where the photoacid generator is selected from the group consisting of bis-1,1-(p-chlorophenyl)-2,2,2-trichloroethane, 1,1-bis[p-methoxyphenyl]-2,2,2-trichloroethane, 1,1-bis[chlorophenyl]2,2,2-trichloroethane and tris[2,3-dibromopropyl]isocyanurate.

* * * * *